United States Patent [19]

Nakagawa

[11] Patent Number: 5,296,728
[45] Date of Patent: Mar. 22, 1994

[54] COMPOUND SEMICONDUCTOR DEVICE WITH DIFFERENT GATE-SOURCE AND GATE-DRAIN SPACINGS

[75] Inventor: Yoshikazu Nakagawa, Kyoto, Japan

[73] Assignee: Rohm Co., Ltd., Kyoto, Japan

[21] Appl. No.: 23,151

[22] Filed: Feb. 24, 1993

Related U.S. Application Data

[60] Continuation of Ser. No. 813,980, Dec. 26, 1991, abandoned, which is a division of Ser. No. 658,218, Feb. 20, 1991, Pat. No. 5,110,751.

[30] Foreign Application Priority Data

Feb. 26, 1990 [JP] Japan .................... 2-45225

[51] Int. Cl.$^5$ ................ H01L 29/80; H01L 31/112
[52] U.S. Cl. .................... 257/282; 257/280; 257/283; 257/284
[58] Field of Search .............. 357/22 R, 22 G, 22 S, 357/54; 257/280, 282, 283, 284

[56] References Cited

U.S. PATENT DOCUMENTS

| 4,656,076 | 4/1987 | Vetanen et al. | 357/22 |
|---|---|---|---|
| 4,839,304 | 6/1989 | Morikawa | 357/22 |
| 4,963,501 | 10/1990 | Ryan et al. | 357/22 |
| 5,105,242 | 4/1992 | Fujihira et al. | 357/22 |
| 5,110,751 | 5/1992 | Nakagawa | 437/40 |

FOREIGN PATENT DOCUMENTS

| 54-884 | 1/1979 | Japan | 437/40 |
|---|---|---|---|
| 59-21193 | 5/1984 | Japan | 437/40 |
| 59-193069 | 11/1984 | Japan | 357/22 |
| 60-4268 | 1/1985 | Japan | 357/22 |
| 60-145669 | 8/1985 | Japan | 357/22 |
| 61-156887 | 7/1986 | Japan | 437/40 |
| 63-21877 | 1/1988 | Japan | 437/40 |
| 63-208275 | 8/1988 | Japan | 357/22 |
| 63-305566 | 12/1988 | Japan | 357/22 |
| 2-18942 | 1/1990 | Japan | 357/22 |

OTHER PUBLICATIONS

Webster's II, New Riverside University Dictionary, 1984, p. 876.
"Low-Noise FET for Microwave Applications" by Kiyoho Kamei et al., *Toshiba Review*, vol. 43, No. 8 (1988), pp. 621-624.

*Primary Examiner*—Rolf Hille
*Assistant Examiner*—Steven Loke
*Attorney, Agent, or Firm*—Brumbaugh, Graves, Donohue & Raymond

[57] ABSTRACT

A compound semiconductor device includes a first semiconductor layer, a second semiconductor layer providing source and drain regions, and a composite layer consisting of a bottom SiN layer, and SiON layer and a top SiN layer on the second semiconductor layer. A gate electrode has a perpendicular portion extending through an opening in the composite layer and an enlarged region above the top SiN layer to support the electrode at a position closer to the source region than the drain region, and the bottom SiN layer and the SiON layer are recessed so as to be spaced from the gate electrode.

4 Claims, 5 Drawing Sheets

COMPOUND SEMICONDUCTOR DEVICE WITH DIFFERENT GATE-SOURCE AND GATE-DRAIN SPACINGS

This application is a continuation of application Ser. No. 07/813,980, filed on Dec. 26, 1991, now abandoned, which is a division of application Ser. No. 07/658,218, filed on Feb. 20, 1991, now U.S. Pat. No. 5,110,751.

BACKGROUND OF THE INVENTION

This invention relates to a process for fabricating compound semiconductor devices. More particularly, this invention relates to a process for fabricating compound semiconductor devices such as high electron mobility transistors (hereinafter referred to simply as "HEMT") that are suitable for use as low-noise amplifying devices operating in the microwave band.

A known process for fabricating a HEMT typically comprises the following steps. In the first step, as shown in FIG. 2a, a GaAs buffer (non-doped GaAs) 1 is overlaid successively with an n+-AlGaAs layer 2 and an n+-GaAs layer 3.

In the second step, as shown in FIG. 2(b), a drain electrode 8 and a source electrode 9 made of a metal establishing an ohmic contact (e.g. AuGe, Ni or Au) are formed on the n+-GaAs layer 3 by conventional methods. For example, the drain electrode 8 and source electrode 9 may be formed by depositing metal by vacuum vapor deposition with a resist pattern having openings being used as a mask. The n+-GaAs layer 3 is recessed at later stages to form a drain region 3a and a source region 3b of the HEMT as shown in FIG. 2(f).

In the third step, as shown in FIG. 2(c), a resist pattern 5 having a reversely tapered opening 4 is formed over the n+-GaAs layer 3 and the electrodes 8 and 9. The opening 4 is reversely tapered in order to facilitate the liftoff process in the sixth step to be described later.

In the fourth step, the part of the n+-GaAs layer 3 that is exposed through the opening 4 is subjected to recess-etching, with the resist pattern 5 being used as a mask, whereby the n+-AlGaAs layer 2 is made exposed as shown in FIG. 2(d). The recess etching is accomplished by wet etching with a commonly used etchant (e.g. a liquid mixture of $H_2O_2$ and $H_2SO_4$).

In the fifth step, with the resist pattern 5 being used as a mask, a gate metal 6 such as Al and W is deposited vertically by vacuum vapor deposition on the area of n+-AlGaAs layer 2 that is exposed through the opening 4, whereby a gate electrode 7 is formed on the n+-AlGaAs layer 2 (see FIG. 2(e)).

In the sixth step, the resist pattern 5 is removed so as to lift off the unwanted gate metal 6, whereby the n+-GaAs layer 3 as well as the drain electrode 8 and source electrode 9 formed on that layer are made exposed, thus completing the process of HEMT fabrication (see FIG. 2(f)).

Generally speaking, the smaller the distance between a gate and source, the smaller the source resistance and hence the low noise characteristic of a HEMT is accordingly improved. As shown in FIG. 2(f), the distance between the gate electrode 7 and the drain region 3a of the device fabricated by the above process is equal to the distance between the gate electrode 7 and the source region 3b. Hence, if one wants to improve the low noise characteristic of the device by reducing the distance between the gate electrode 7 and the source region 3b, the distance between the gate electrode 7 and the drain region 3a will inevitably decrease, causing a substantial drop in the breakdown voltage between the gate and drain.

With a view to solving this problem, Unexamined Published Japanese Patent Application No. 21877/1988 proposed that the distance between the gate electrode and the drain region be reduced by oblique vacuum vapor deposition of a mask material. However, according to this method, the position of an opening in the mask is determined by the amount of the oblique deposition, so that it is very difficult to form the gate electrode at a desired position with high precision.

The most effective way to improve the low noise characteristic of a HEMT is to shorten the gate length, thereby reducing the gate capacitance ($C_{gs}$) while increasing the transconductance ($g_m$) In fact, however, a shorter gate length leads to a greater gate resistance, which may result in a deteriorated low noise characteristic.

SUMMARY OF THE INVENTION

The present invention has been made under these circumstances and has an object of providing a process that is capable of fabricating a compound semiconductor device with the distance between a gate electrode and a source region and that between the gate electrode and a drain region being controlled with high precision.

Another object of the present invention is to provide a process for fabricating a compound semiconductor device that has a smaller gate resistance and a shorter gate length.

These objects of the present invention can be attained by a process that comprises:

the first step of forming successively a first semiconductor layer, a second semiconductor layer for a source and a drain, and a first structural layer on a semiconductor substrate;

the second step of forming a first resist pattern with a predetermined opening on the first structural layer;

the third step of etching an area of the first structural layer that is exposed through the opening, with the first resist pattern being used as a mask, to thereby make the second semiconductor layer exposed, and thereafter removing the first resist pattern;

the fourth step of forming successively a second structural layer and a third structural layer over the exposed area of the second semiconductor layer and the entire first structural layer, the second structural layer being dissoluble by a particular etchant and the third structural layer being less dissoluble than the second structural layer by the etchant;

the fifth step of forming on the third structural layer a second resist pattern having an opening that is located over the etched area of the first structural layer and that is distant from an area where a drain is to be formed and close to an area where a source is to be formed;

the sixth step of etching the second and third structural layers, with the second resist pattern being used as a mask, so as to make the second semiconductor layer exposed, and thereafter removing the second resist pattern;

the seventh step of side-etching the second structural layer with the above etchant through the opening that has been formed in the third structural layer by the etching in the sixth step;

the eighth step of making the first semiconductor layer exposed by etching an area of the second semiconductor layer that is exposed through a hole that has been formed in the second structural layer by the side etching; and the ninth step of vapor-depositing a gate metal vertically on the first semiconductor layer that is exposed through the opening formed in the third structural layer.

If desired, a step in which a third resist pattern having an opening larger than the opening formed in the third structural layer by the etching in the sixth step is formed in such a way that the latter opening is positioned within the former opening, is provided between the sixth and seventh steps, and the gate metal to be formed on the first semiconductor layer in the ninth step is vapor-deposited until it is deposited to a height exceeding the third structural layer.

If a gate electrode is to be formed in a position that is close to a source region and distant from a drain region, the process of the present invention having the features described above insures that the position of the source region is determined by the source-side edge of the first structural layer formed by the etching in the third step, that the position of the drain region is determined by the drain-side edge of the second structural layer formed by the side etching in the seventh layer, and that the position of the gate electrode is determined by the opening formed in the third structural layer by the etching in the sixth step.

DESCRIPTION OF THE PREFERRED EMBODIMENT

An embodiment of the present invention is described below in detail with reference to FIG. 1.

FIGS. 1(a) – 1(k) show the sequence of steps of fabricating a compound semiconductor device according to the embodiment of the present invention. The figures depict in cross section the structures that ar produced in the individual steps of the process. The following description assumes that the semiconductor device to be fabricated is a HEMT, but it should be understood that the process of the present invention is also applicable to other compound semiconductor devices such as low-noise GaAs FETs.

Figure 1A:
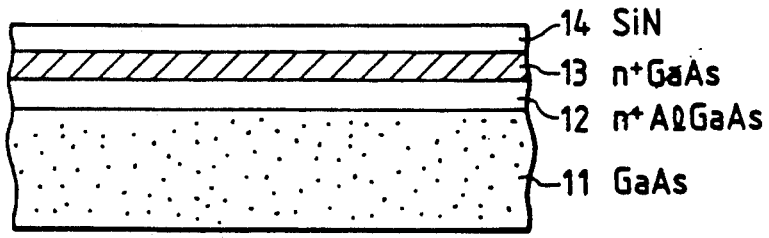
FIGS. 1(a) through 1(k) show the sequence of steps of fabricating a compound semiconductor device according to an embodiment of the present invention.

The process starts with step (a) in which a GaAs buffer 11 used as a semiconductor substrate is overlaid in superposition with an n+-AlGaAs layer 12, an n+-GaAs layer 13 for forming a source and a drain, and an insulating SiN layer 14 (see FIG. 1(a)).

Figure 1B:
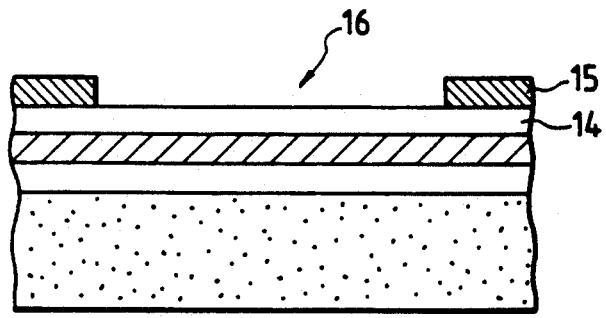

In the next step (b) a resist pattern 15 having a predetermined opening 16 is formed over the SiN layer 14 (see FIG. 1(b)). In the embodiment under discussion, the resist pattern 15 is formed by conventional photolithography.

In step (c), the area of SiN layer 14 that is exposed through the opening 16 is etched, with the resist pattern 15 being used as a mask, whereby the corresponding area of the n+-GaAs layer 13 is made exposed. Thereafter, the resist pattern 15 is removed (see FIG. 1(c)). The etching may be performed by common wet etching or dry etching technique.

Figure 1C:
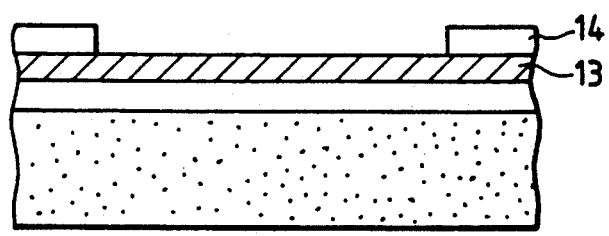
Figure 1D:
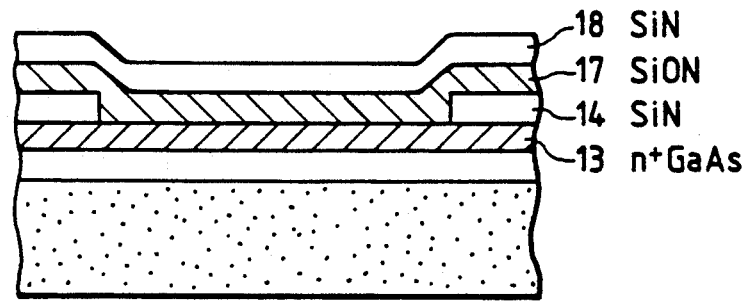

In step (d), a SiON layer 17 and a SiN layer 18 are successively formed over the exposed area of the n+-GaAs layer 13 and the entire SiN layer 14 (see FIG. 1(d)).

Figure 1E:
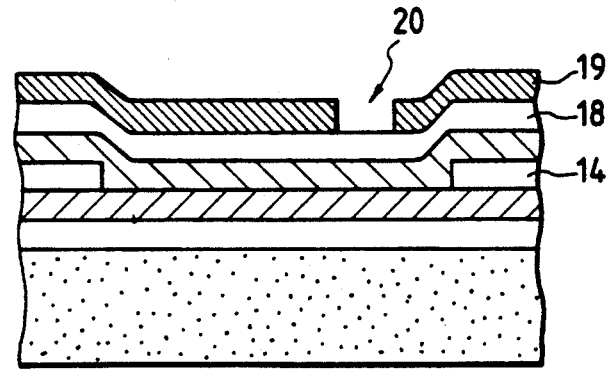
Figure 1F:
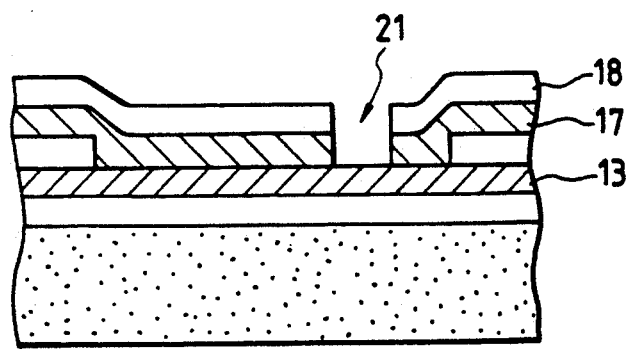

In step (e), a resist pattern 19 having the opening 20 that is located over the etched area (see FIG. 1(c)) of the SiN layer 14 and that is distant from the area where a drain is to be formed and close to the area where a source is to be formed, is formed over the SiN layer 18 (see FIG. 1(e)). The left side of FIG. 1(e) is the area where a drain is to be formed and the right side is where a source is to be formed. The size of the opening 20 corresponds to the "gate length" which is to be discussed later. In other words, the gate length is determined by the opening 20.

In step (f), the SiON layer 17 and SiN layer 18 are etched, with the resist pattern 19 being used as a mask, whereby the corresponding area of the n+-GaAs layer 13 is made exposed. Thereafter, the resist pattern 19 is removed (see FIG. 1(f)). In the embodiment under discussion, the etching in step (f) is performed by a dry etching technique such as reactive ion etching (RIE) and, therefore, a hole 21 substantially equal in size to the opening 20 can be formed in the SiON layer 17 and the SiN layer 18 by anisotropic etching.

Figure 1G:
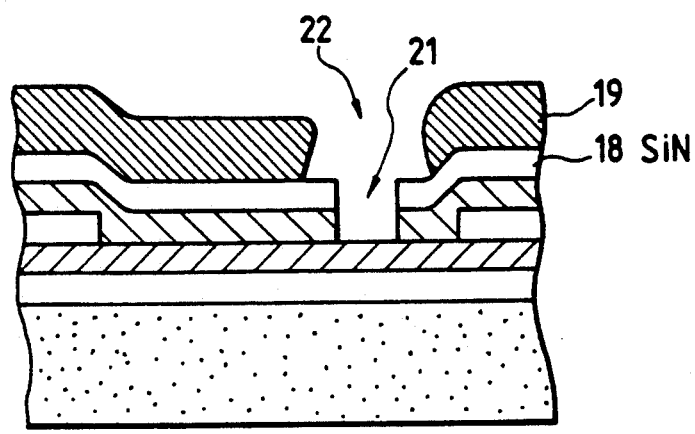

In step (g), a resist pattern 19 having the opening 22 larger than the hole 21 formed in the SiN layer 18 by the etching in step (f) is formed in such a way that the hole 21 is located within the opening 22 (see FIG. 1(g)). The size of the opening 22 corresponds to the top size of a gate electrode 27 which is to be discussed later (see FIG. 1(k)). The opening 22 is reversely tapered in order to insure that the resist pattern 19 can be readily lifted off in step (k) to be discussed later.

Figure 1H:
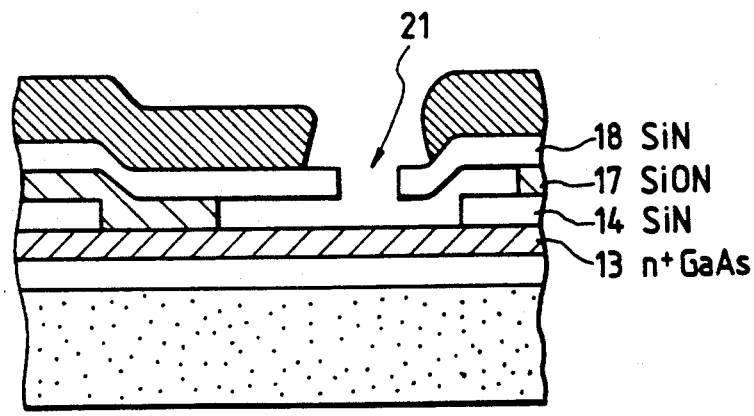

In step (h), the SiON layer 17 is side-etched with a particular etchant through the hole 21 formed in the SiN layer 18 (see FIG. 1(h)). Hydrofluoric acid may be used as this etchant for the side etching. Hydrofluoric acid etches faster a compound that contains many oxygen atoms. Hence, the SiON layer 17 is dissolved by hydrofluoric acid, but the SiN layer 18 is less dissoluble than the SiON layer 17. In the embodiment, both the SiON layer 17 and SiN layer 18 are made of an insulating material, but this is not necessarily the case of the present invention. The structural layers to be combined with the particular etchant may be composed of suitable materials having different solubilities in that etchant. For example, a $SiO_n$ layer may be used instead of the SiON layer 17. In the embodiment, the SiN layer 14 is side-etched until the source-side SiN layer 14 becomes exposed, so that the position of the area of the n+-GaAs layer 13 where a source region is to be created is determined with respect to the gate electrode 27 (see FIG. 1(k)).

Figure 1I:
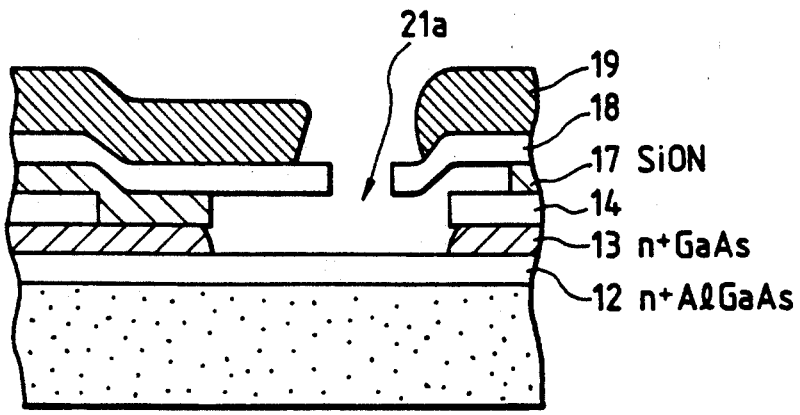
Figure 2A:
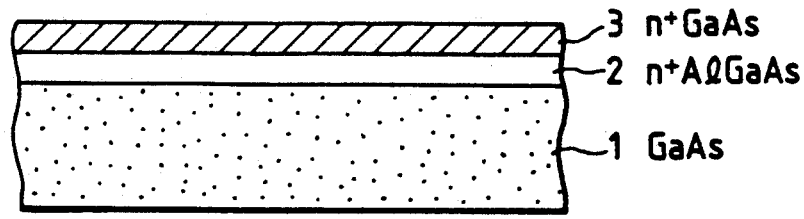
FIGS. 2(a) through 2(f) show the sequence of steps of fabricating a compound semiconductor device by a prior art process.
Figure 2B:
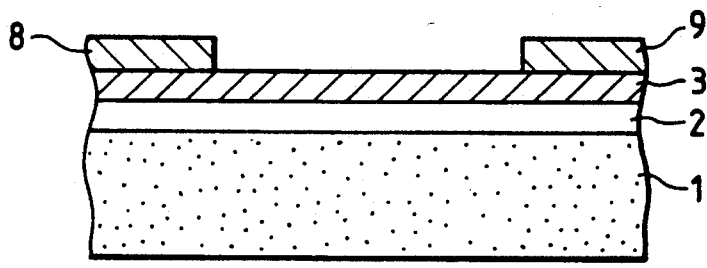
Figure 2C:
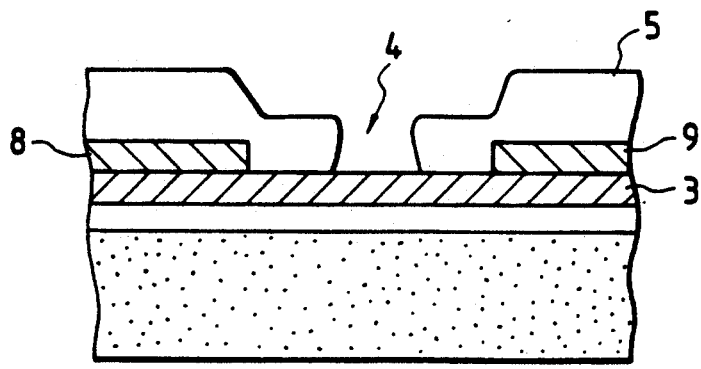
Figure 2D:
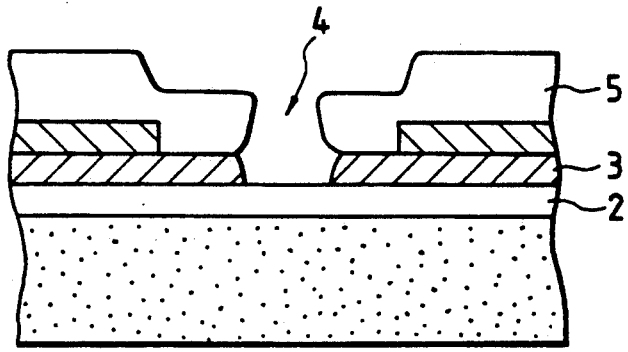
Figure 2E:
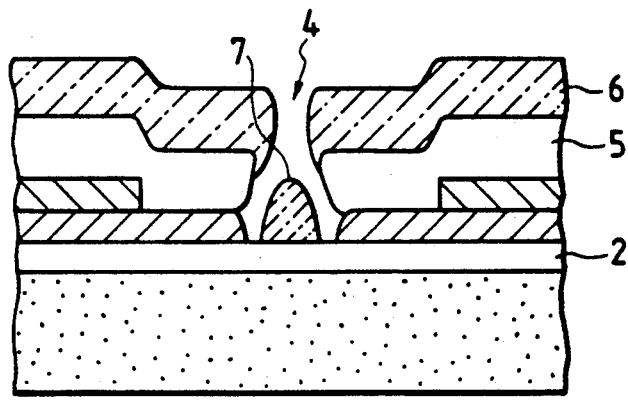
Figure 2F:
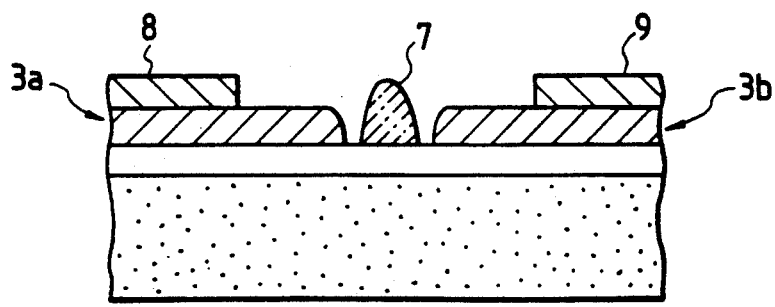

In step (i), the area of the n+-GaAs layer 13 that is exposed through a hole 21a formed in the SiON layer 17 by the side etching in step (h) is etched to make the n+-AlGaAs layer 12 exposed (see FIG. 1(i)). The etching performed in step (i) is recess etching of the same type as performed in the third step of the prior art process shown in FIG. 2(c), and can be accomplished by a known wet etching process.

Figure 1J:
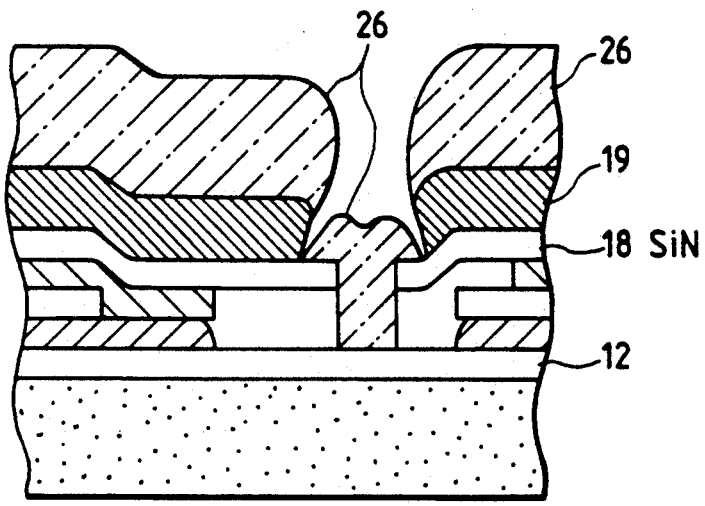

In step (j), a gate metal 26 such as Al and W is vapor-deposited vertically on the n+-AlGaAs layer 12 that is exposed through the hole 21 (see FIG. 1(j)). The metal deposition is continued until the layer of the gate metal 26 is deposited on the n+-AlGaAs layer 12 to a height exceeding the SiN layer 18.

Figure 1K:
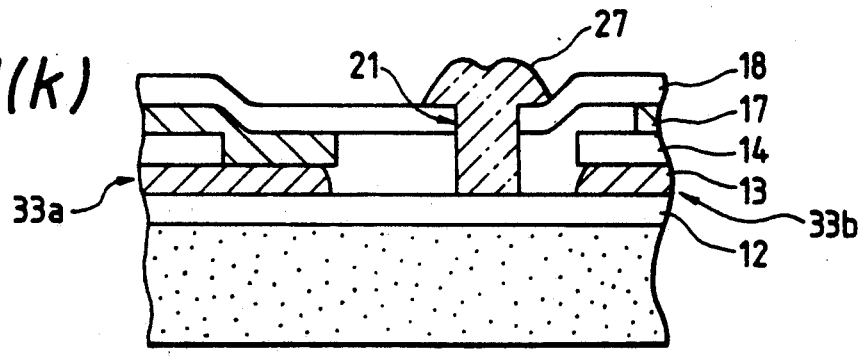

In step (k), the resist pattern 19 (see FIG. 1(j)) is removed to lift off the unwanted layer of the gate metal 26 deposited over the resist pattern 19 (see FIG. 1(k)). As shown, the resulting gate electrode 27 is larger in the top than in the lower part, and its cross section will be shaped like either T or a mushroom depending upon the size of the hole 21 in the SiN layer 18 and the amount of the gate metal 26 deposited in step (j). Hence, the gate resistance of the device is small despite the short gate length. The gate electrode 27 is formed in such a way that it is supported by the insulating SiN layer 18. Therefore, in order to enhance the mechanical stability of the gate electrode 27, part of the SiN layer 14, SiON layer 17 and SiN layer 18 may be left intact. The steps of forming a drain and a source electrode are omitted from the above description, but it should be understood that those electrodes can be formed in the same manner as in the prior art process (see FIG. 2). As described above, the gate electrode 27 can be positioned distant from a drain region 33a and closer to a source region 33b.

As described on the foregoing pages, according to the invention, the position which the gate electrode is to be formed is determined by the hole formed in the third structural layer (i.e., SiN layer 18). Further, the hole in the third structural layer is formed by etching. Hence, the distance between the gate electrode and the source region as well as the distance between the gate electrode and the drain region can be controlled with high precision. Since the gate electrode can be formed at a position that is close to the source region and distant from the drain region, the present invention is capable of fabricating a HEMT of good low-noise characteristic that has a high gate-drain breakdown voltage and a small source resistance.

If the gate metal to be formed on the first semiconductor layer (i.e., n+-AlGaAs layer 12) is evaporated until it is deposited to a height exceeding the third structural layer, the present invention is capable of fabricating a compound semiconductor device that has a small gate resistance and a short gate length and which hence is suitable for use as a HEMT having good low-noise characteristic.

What is claimed is:

1. A compound semiconductor device comprising:
    a compound semiconductor layer;
    a source region and a drain region formed on the compound semiconductor layer;
    a composite structural layer including at least first, second and third layer portions formed over the source and drain regions having an opening located between the source and drain regions and forming edges of the first, second and third layer portions; and
    a gate electrode having a perpendicular portion extending through the opening in the structural layer substantially perpendicularly to the compound semiconductor layer and located closer to the source region than to the drain region, the edges of at least one of the second and third layer portions adjacent to the source region and the drain region, respectively, being spaced from the perpendicular portion of the gate electrode by different distances, and the first layer portion extending above the second and third layer portions to engage the gate electrode, the gate electrode also having an enlarged portion above the first layer portion of the structural layer which extends beyond the opening therein in a direction parallel to the structural layer so that the structural layer supports the enlarged portion of the gate electrode 2. A compound semiconductor device according to claim 1 wherein the other of the second and third layer portions is also spaced from the perpendicular portion of the gate electrode.

3. A compound semiconductor device according to claim 2 wherein the first, second and third layer portions of the structural layer are a SiN layer, a SiON layer, and a SiN layer, respectively.

4. A compound semiconductor device according to claim 2, wherein the edge of the source region adjacent to the perpendicular portion of the gate electrode is substantially flush with the edge of the third layer portion of the structural layer and the edge of the drain region adjacent to the perpendicular portion of the gate electrode is substantially flush with the edge of the second layer portion of the structural layer.

* * * * *